United States Patent [19]

Brandhorst, Jr. et al.

[11] Patent Number: 5,019,176
[45] Date of Patent: May 28, 1991

[54] THIN SOLAR CELL AND LIGHTWEIGHT ARRAY

[75] Inventors: Henry W. Brandhorst, Jr., Berea; Irving Weinberg, Rocky River, both of Ohio

[73] Assignee: The United States of America as represented by the Administrator of the National Aeronautics and Space Administration, Washington, D.C.

[21] Appl. No.: 495,969

[22] Filed: Mar. 20, 1990

[51] Int. Cl.$^5$ .................... H01L 31/042; H01L 31/18
[52] U.S. Cl. .................................... 136/244; 136/249; 136/256; 357/30; 437/2
[58] Field of Search .......... 136/244, 246, 255, 249 TJ, 136/256; 357/30 J, 30 L, 30 Q; 437/2-5

[56] References Cited

U.S. PATENT DOCUMENTS

| | | | |
|---|---|---|---|
| 3,472,698 | 10/1969 | Mandelkorn | 136/256 |
| 4,053,327 | 10/1977 | Meulenberg, Jr. | 136/256 |
| 4,084,985 | 4/1978 | Evans, Jr. | 136/251 |
| 4,169,738 | 10/1979 | Luque | 136/246 |
| 4,294,602 | 10/1981 | Horne | 65/40 |
| 4,295,002 | 10/1981 | Chappell et al. | 136/244 |
| 4,379,202 | 4/1983 | Chalmers | 136/256 |
| 4,450,033 | 5/1984 | Little | 156/380.8 |
| 4,589,191 | 5/1986 | Green et al. | 437/2 |
| B1 4,610,077 | 5/1988 | Minahan et al. | 437/2 |
| 4,694,115 | 9/1987 | Lillington et al. | 136/256 |
| 4,714,510 | 12/1987 | Holt | 437/2 |
| 4,746,371 | 5/1988 | McLeod et al. | 136/249 TJ |
| 4,824,489 | 4/1989 | Cogan et al. | 136/256 |
| 4,854,975 | 8/1989 | Krause | 136/262 |

FOREIGN PATENT DOCUMENTS

| | | | |
|---|---|---|---|
| 59-213177 | 12/1984 | Japan | 136/246 |
| 60-117688 | 6/1985 | Japan | 136/256 |
| 63-226971 | 9/1988 | Japan | 136/256 |

OTHER PUBLICATIONS

NASA Technical Memorandum 102058–"Indium Phosphate–Into the Future" Mar. 20, 1989.

Primary Examiner—Aaron Weisstuch
Attorney, Agent, or Firm—Gene E. Shook; John R. Manning; James A. Mackin

[57] ABSTRACT

A thin, lightweight solar cell utilizes front contact metallization. Both the front light receiving surface of the solar cell and the facing surface of the cover glass are recessed to accommodate this metallization. This enables the two surfaces to meet flush for an optimum seal.

26 Claims, 5 Drawing Sheets

THIN SOLAR CELL AND LIGHTWEIGHT ARRAY

ORIGIN OF THE INVENTION

The invention described herein was made by employees of the United States Government and may be manufactured and used by or for the Government for governmental purposes without the payment of any royalties thereon or therefore.

TECHNICAL FIELD

This invention is concerned with an improved solar cell that is both thin and lightweight. The invention is particularly directed to a solar cell which incorporates improved positioning of the electrical contacts, as well as improved bonding between the cell and the cover glass.

Interdigitated contact patterns have been suggested for silicon solar cells. However, the proposed interdigitated contacts and cell junctions were located on the rear surface of each cell.

Positioning interdigitated contacts and junctions on the rear surface of the cell leads to poor radiation resistance in the particulate radiation environment of space. Also, because most of the incident light is absorbed near the front surface of the cell, placing the metallization at the rear surface of the cell creates an inordinately long path for light generated current carriers, such as electrons and holes, to reach the collection junctions and contact metallization. In such a situation, the light generated current carriers have a greater probability of being trapped by defects in the cell. This leads to excessive reduction of cell output caused by defects created by exposure to particles, such as protons and electrons, in a space radiation environment.

Problems have been encountered in placing contacts on the front surface of the cell because they protrude above the cell surface, whether they are interdigitated or not. This creates difficulties in achieving a good electrostatic bond between the cell and the cover glass.

It is, therefore, an object of the present invention to provide an improved thin, lightweight solar cell having all contact metallization at the front or light incident surface.

Another object of the invention is to provide such a solar cell having improved electrostatic bonding between the solar cell and the cover glass.

A still further object of the invention is to provide an improved solar cell having no protruding metallization of the contacts above the surface of the solar cell.

BACKGROUND ART

U.S. Pat. No. 4,295,002 to Chappell et al discloses a dual surface solar cell to provide additional efficiency. These surfaces are composed of different materials with different radiation absorption characteristics. The cover glass is affixed to one side of the cell and the contact metal to the other. The metal contact could be on the front depending on the orientation of the cell.

U.S. Pat. No. 4,589,191 to Green et al is directed to a high efficiency solar cell with mounted metallization. The cover glass is referred to an antireflective coating, and it is illustrated as grooved to meet the top metallization.

U.S. Pat. No. B1 4,610,077 to Minahan et al describes a wraparound metallization for a solar cell. Front metallization is effectively achieved by this method.

U.S. Pat. No. 4,694,115 to Lillington et al is concerned with a solar cell with front surface metallization. There are two antireflective coatings, both of which fall beneath the front contact metallization.

U.S. Pat. No. 4,824,489 to Cogan et al illustrates a typical prior art arrangement for a thin solar cell. U.S. Pat. No. 4,854,975 to Krause describes both P-type and N-type layers exposed on the front surface of a solar cell making front contact metallization possible.

DISCLOSURE OF THE INVENTION

The objects are achieved by the thin, light weight solar cell of the present invention which utilizes front contact metallization. Both the front light receiving surface of the solar cell and the facing surface of the cover glass are recessed to accommodate this metallization. This enables the two surfaces to meet flush for an optimum seal.

BRIEF DESCRIPTION OF THE DRAWINGS

The objects, advantages, and novel features of the invention will be more fully apparent from the following detailed description when read in connection with the accompanying drawings in which.

BEST MODE FOR CARRYING OUT THE INVENTION

Figure 1:
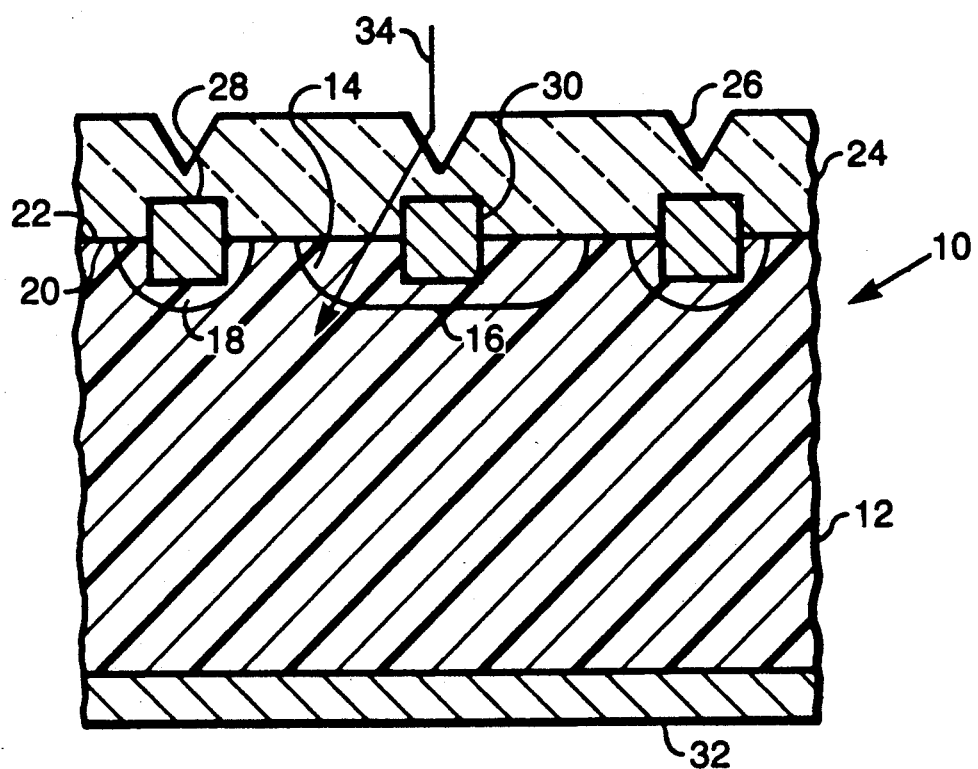
FIG. 1 is an enlarged vertical section view of a thin solar cell attached to a cover glass in accordance with the present invention.

Referring now to FIG. 1, there is shown a photovoltaic device such as a solar cell 10 constructed in accordance with the present invention. The solar cell 10 includes a wafer 12 of a P-type material such as indium phosphide having n+ regions 14 forming junctions 16. The InP wafer 12 also has a plurality of p+ regions 18.

The front or light receiving surface 20 of the wafer 12 is adjacent to the regions 14 and 18. This surface is covered by an antireflection coating 22. This front surface 20 and coating 22 are protected by a cover glass 24 having a plurality of triangular V-grooves 26 therein. A plurality of metal contacts 28 and 30 shown in FIG. 3 extend into both the wafer 12 and the cover glass 24 as shown in FIGS. 1 and 2.

A suitable backing 32 covers the surface of the wafer 12 that is opposite the front or light receiving surface. This backing is preferably a commercially available material called Kapton.

Figure 2:
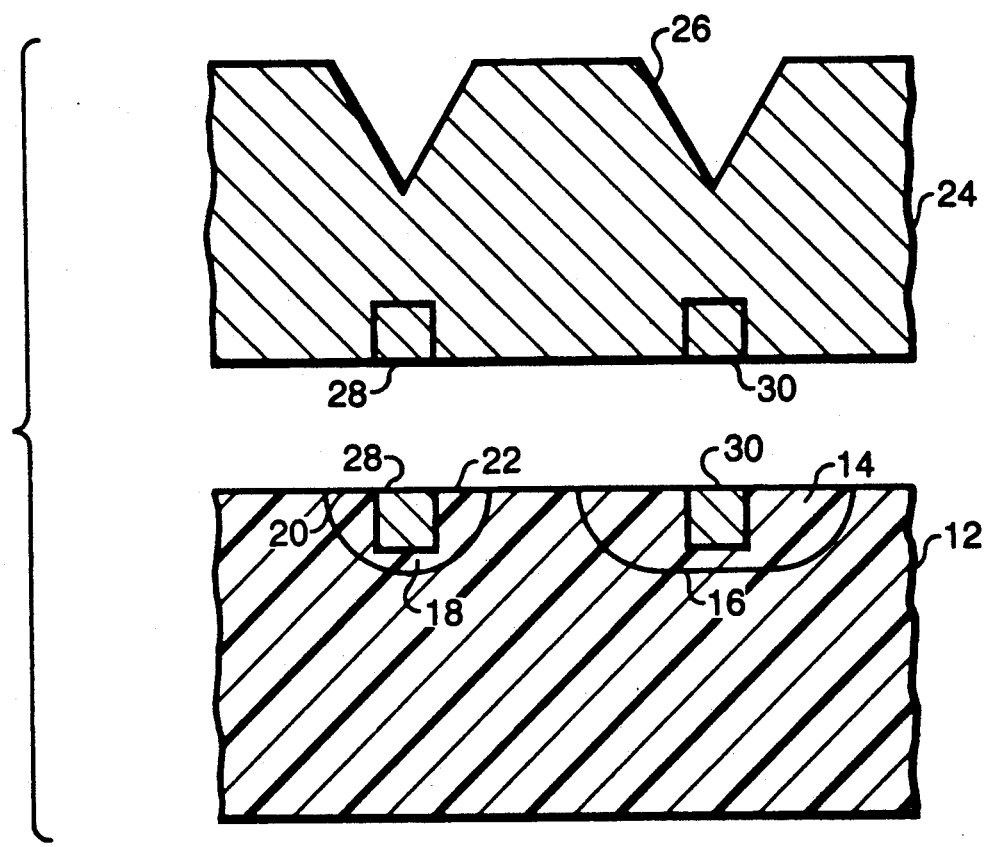
FIG. 2 is an enlarged vertical section view of a portion of the solar cell shown in FIG. 1 prior to the attachment of the cover glass to the solar cell.

Referring now to FIG. 2, the n+ regions 14 and p+ regions 18 of the semiconductor wafer 12 are produced by diffusion of an appropriate dopant into the semiconductor material using photolithographic masking techniques to form these regions on the upper surface. The antireflection coating 22 is then deposited on the front surface of the solar cell 10.

Figure 3:
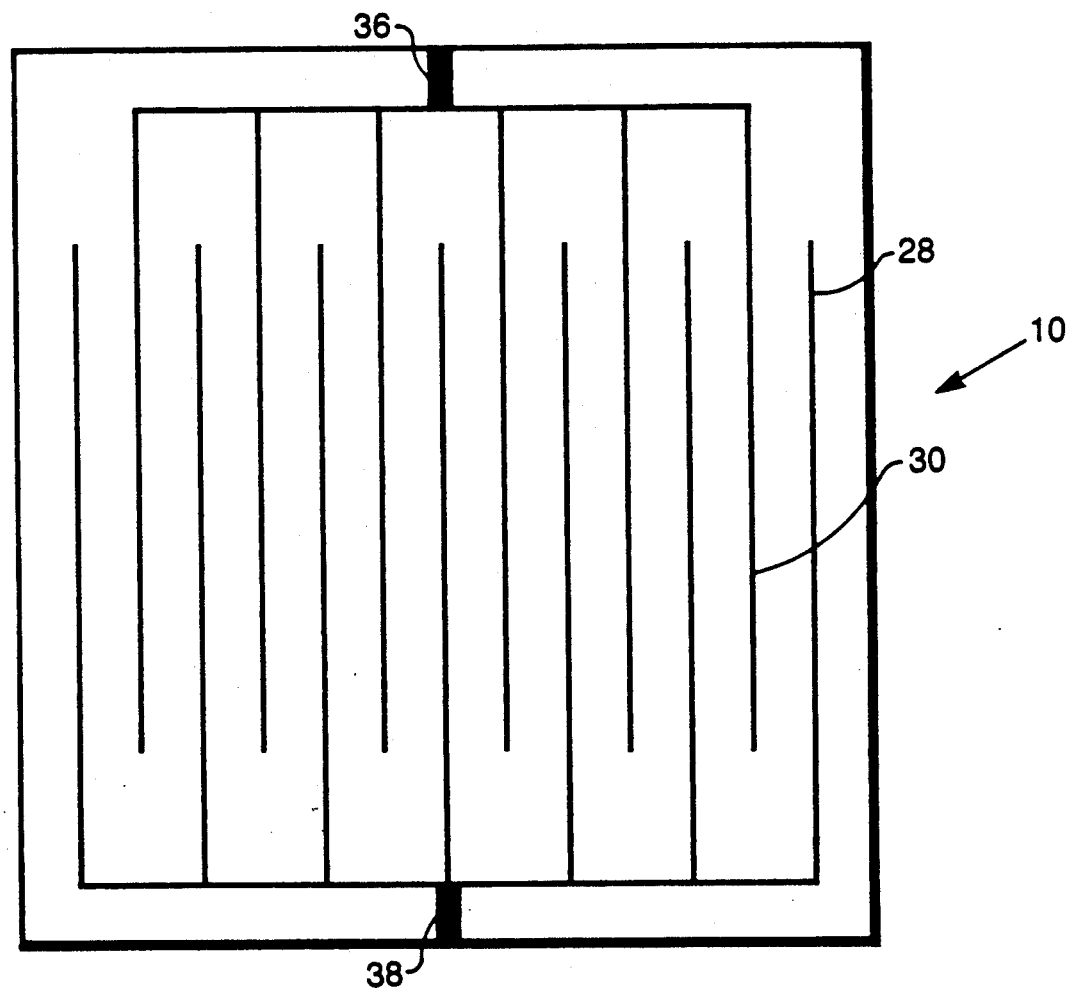
FIG. 3 is a plan view of a solar cell constructed in accordance with the present invention showing the metallization pattern on the top surface thereof.

Metallization grooves or recesses are etched or laser scribed into the semiconductor surface in the interdigitated pattern shown in FIG. 3 using appropriate masks. The metal contacting material 28 and 30 is then deposited into these recesses and treated so as to be flush with the top of the antireflecting coating 22.

The cover glass 24 is first processed to include the triangular V-grooves 26 in the light receiving surface and the opposite surface is recessed to include the grooves that will eventually contain the metallization. The metallization recesses are aligned with the triangular V-grooves 26 to minimize contact shadowing of incident light. These recesses are then filled, by deposition of metal, by plating, evaporation, or other means well known in the art, up to the surface of the glass 24 using appropriate masking techniques.

The cover glass 24 and wafer 12 are aligned so that their metallizations 28 and 30 coincide. These two members are then joined together by electrostatic bonding.

Referring again to FIG. 1, the backing 32 is attached to the wafer 12 by a suitable adhesive. A silicone adhesive known commercially as DC-93500 has been satisfactory for securing the backing 32 to the wafer 12. It is contemplated that the rear surface of the wafer 12 may be covered with a deposited glass-like layer, such as sol gel, as an alternative to the use of the Kapton backing 32.

A light ray 34 entering the front of the cell through the V-groove 26 is refracted away from the contact 30. This light enter the front surface of the cell 10 thereby producing both majority and minority carriers. Both of these carriers diffuse towards the front surface 20 of the cell 10. The minority carriers travel across the cell junction 16 to the contact 30 and thence to an external circuit through an N contact 36 shown in FIG. 3. Majority carriers travel to the other cell contacts 28 through the heavily doped area 18 and thence to the externally connected load through a P contact 38.

Figure 4:
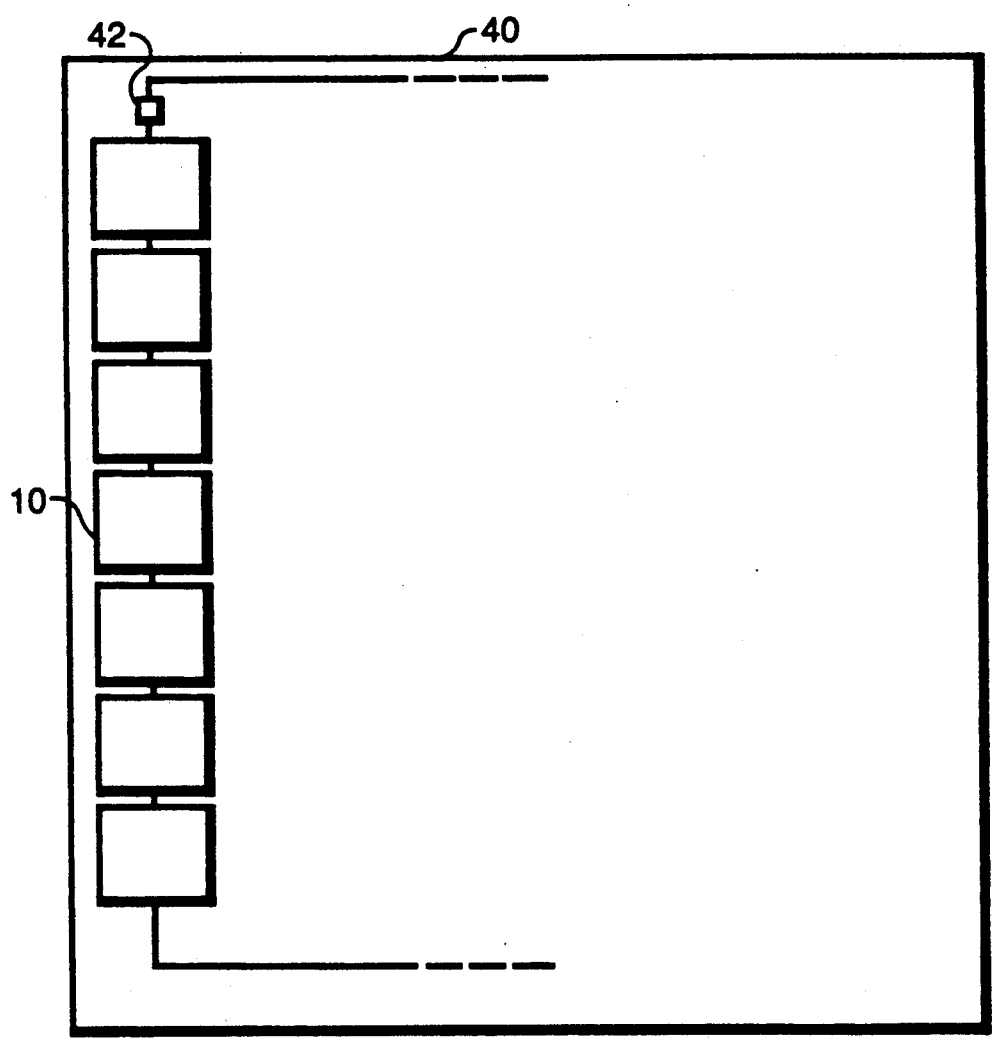
FIG. 4 is a plan view of a lightweight array of solar cells constructed in accordance with the present invention arranged on a glass superstrate.

Referring now to FIG. 4, there is shown an array component that is constructed using the procedures set forth above. More particularly, metal contacts are incorporated into appropriate recesses produced in a glass superstrate 40. In this manner, the superstrate 40 serves dual functions of acting as a cell cover such as the cover glass 24 shown in FIG. 1 and providing a measure of mechanical support for the array component. Interconnects between cells 10 and blocking diodes 42 are formed of metal evaporated onto and/or recessed into the surface of the glass superstrate 40. When assembling the array components care is taken to align the cell contacts with the superstrate metallization. A Kapton backing is added to this component of the array when combined into a larger array comprising of a multiplicity of such components structures. While only one string of solar cells 10 is shown in FIG. 4, the complete unit contains additional strings.

DESCRIPTION OF ALTERNATE EMBODIMENTS

The assembly shown in FIGS. 1 and 2 illustrate a cell in an n+ p configuration. However, for the III-IV semiconductors the p+ n configuration can also be used. In this embodiment, the main body of the cell is an n-type semiconductor, and the regions n+ and p+ in FIGS. 1 and 2 would then be changed to p+ and n+, respectively.

Figure 5:
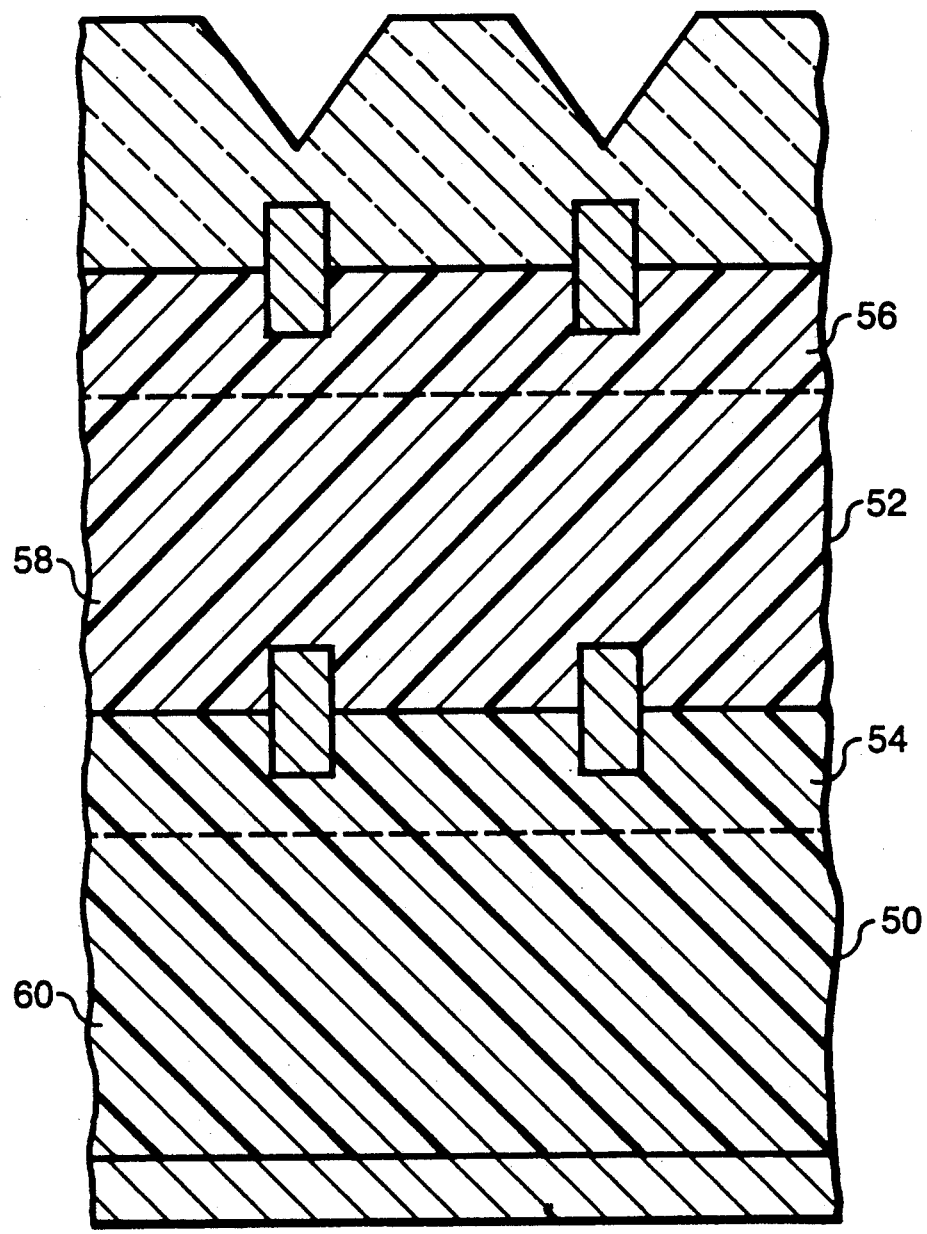
FIG. 5 is a section view of a portion of a multibandgap cell showing the use of recessed metallization and improved bonding between the cells.

Recessed metallization is applicable to a multibandgap cell of the type shown in FIG. 5 which includes a bottom cell 50 and a top cell 52. These cells include regions 54 and 56 that are the n+ regions of the bottom and top cells, respectively. Regions 58 and 60 are the p regions of the top and bottom cells, respectively. While both cells are shown in the n+p configuration they may also be produced in the p+n configuration. In this reversed embodiment, the main body of each cell is an n type semiconductor and the regions 56 and 54 in FIG. 5 would be changed to p+.

In this two junction cell, the bottom cell 50 and the top cell 52 both contain metallization grooves. After these grooves are appropriately filled with the proper metals, the cells 50 and 52 are joined together by electrostatic bonding.

The multijunction cells can be incorporated into an array, such as shown in FIG. 4, or into an array of concentrators. All of the planar cells of the present invention can be used in concentrators with appropriate attention being directed toward series resistance and contact configuration considerations, as well as a variety of cover materials and backings.

It is evident from the description as well as the drawings, that placing cell junctions and metallization on the front or incident light receiving surface, rather than on the rear or back surface of the cell, results in a shorter path for light generated current carriers to reach the junction metallization. This results in a decreased probability of trapping by defects and thus increases radiation resistance and increases end-of-life output in a space radiation environment.

The use of the grooved cover glass eliminates light shadowing by the front interdigitated contacts. The use of recessed contact metallization rather than metallization at the front of the cell which projects outwardly from the cell surface eliminates a major difficulty in achieving good strong electrostatic bonding between the glass and semiconductor and between semiconductors. Likewise, the use of electrostatic bonding which is greatly facilitated by the present invention eliminates the use of UV degrading adhesives between the cover glass and solar cell. Thus, it is unnecessary to coat the cover glass with an expensive UV rejection coating in order to protect the adhesive.

While several embodiments of the invention have been shown and described it will be appreciated that various structural modifications may be made to the solar cell assembly without departing from the spirit of the invention and the scope of the subjoined claims.

We claim:

1. A solar cell assembly comprising
    a solar cell having a front surface for receiving incident light and an oppositely disposed rear surface,
    a cover glass adjacent to said front surface,
    contact metallization between said cover glass and said solar cell, said contact metallization being embedded in both said cover glass and said, solar cell thereby creating a smooth interface therebetween, and
    means for refracting incident light away from said contact metallization.

2. A solar cell assembly as claimed in claim 1 wherein the cover glass is electrostatically bonded to the solar cell.

3. A solar cell assembly as claimed in claim 1 including a plurality of grooves in the cover glass for refracting the incident light away from the contact metallization to inhibit shadowing.

4. A solar cell assembly as claimed in claim 3 wherein the contact metallization has an interdigitated pattern.

5. A solar cell assembly as claimed in claim 4 wherein the grooves are in substantial alignment with the contact metallization.

6. A solar cell assembly as claimed in claim 5 wherein the grooves have triangular V configurations.

7. A solar cell assembly as claimed in claim 3 including an antireflection coating covering the front surface of solar cell.

8. A solar cell assembly as claimed in claim 7 wherein the antireflection coating is between the front surface and the cover glass.

9. A solar cell assembly as claimed in claim 8 wherein the cover glass comprises a superstrate covering a plurality of solar cells in an array.

10. A solar cell assembly as claimed in claim 1 including another solar cell bonded to said rear surface, and additional contact metallization between said rear surface and said other solar cell thereby forming a multibandgap cell.

11. In a solar cell assembly of the type having contact metallization on the front light receiving surface of a solar cell with a cover glass for protecting the same, the improvement comprising means for recessing said contact metallization in both the front light receiving surface of said solar cell and the facing surface of the cover glass thereby providing a smooth interface therebetween for electrostatic bonding, and a plurality of grooves in the cover glass for refracting incident light away from the contact metallization.

12. A solar cell assembly as claimed in claim 11 wherein the contact metallization has an interdigitated pattern.

13. A solar cell assembly as claimed in claim 12 wherein the contact metallization in contained in aligned recesses in both the front surface of the solar cell and the surface of the cover glass opposite the surface having the light refractory grooves, said recesses containing the contact metallization being in substantial alignment with the light refractory grooves.

14. A solar cell assembly as claimed in claim 13 wherein the grooves have triangular V configurations.

15. A solar cell assembly as claimed in claim 11 including an antireflection coating between the front light receiving surface and the cover glass.

16. A method of making a solar cell assembly of a semiconductor wafer having a light receiving surface protected by a cover glass comprising the steps of producing p+ regions and n+ regions in said semiconductor wafer by diffusing dopants into said light receiving surface, forming a plurality of triangular light refractory grooves in one surface of said cover glass, masking said light receiving surface of said wafer and another surface of said cover glass opposite said one surface thereof, forming a plurality of recesses in said masked surfaces of said wafer and said cover glass, depositing metal contacting material into said recesses up to said surfaces thereby creating a smooth interface therebetween, aligning the filled recesses in the cover glass with the filled recesses in the wafer so that the metal contacting materials coincide, joining the cover glass to the wafer by electrostatic bonding of the smooth interface, and covering the surface of the wafer that is opposite the light receiving surface.

17. A method of making a solar cell assembly as claimed in claim 16 wherein the dopants are diffused into the semiconductor wafer by using photolithographic masking techniques.

18. A method of making a solar cell assembly as claimed in claim 17 wherein an antireflection coating is deposited on the light receiving surface after the dopants are diffused thereinto.

19. A method of making a solar cell assembly as claimed in claim 16 wherein the recesses are formed in an interdigitated pattern.

20. A method of making a solar cell assembly as claimed in claim 19 wherein the recesses are formed by etching.

21. A method of making a solar cell assembly as claimed in claim 19 wherein the recesses are formed by laser scribing.

22. A method of making a solar cell assembly as claimed in claim 19 wherein the metal contacting material is deposited in the recess by plating.

23. A method of making a solar cell assembly as claimed in claim 19 wherein the metal contacting material is deposited in the recesses by evaporation.

24. A method of making a solar cell assembly as claimed in claim 16 wherein the recesses are formed in the cover glass in substantial alignment with the triangular light refractory V-grooves.

25. A method of making a solar cell assembly as claimed in claim 16 wherein the surface of the wafer opposite the light receiving surface is covered by attaching a backing material thereto.

26. A method of making a solar cell assembly as claimed in claim 17 wherein the surface of the wafer opposite the light receiving surface is covered by depositing a glass-like layer therein.

* * * * *